(12) United States Patent
Hung et al.

(10) Patent No.: US 11,758,720 B2
(45) Date of Patent: Sep. 12, 2023

(54) FLASH MEMORY CELL

(71) Applicant: UNITED MICROELECTRONICS CORP., Hsin-Chu (TW)

(72) Inventors: Chia-Min Hung, Tainan (TW); Ping-Chia Shih, Tainan (TW); Che-Hao Kuo, Tainan (TW); Kuei-Ya Chuang, Chiayi County (TW); Ssu-Yin Liu, Kaohsiung (TW); Po-Hsien Chen, Tainan (TW); Wan-Chun Liao, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/077,183

(22) Filed: Dec. 7, 2022

(65) Prior Publication Data

US 2023/0103976 A1 Apr. 6, 2023

Related U.S. Application Data

(63) Continuation of application No. 17/198,268, filed on Mar. 11, 2021, now Pat. No. 11,552,088.

(51) Int. Cl.
*H10B 41/30* (2023.01)
*H01L 29/423* (2006.01)
*H01L 29/66* (2006.01)
*H01L 21/28* (2006.01)
*H01L 29/788* (2006.01)

(52) U.S. Cl.
CPC ........ *H10B 41/30* (2023.02); *H01L 29/40114* (2019.08); *H01L 29/42328* (2013.01); *H01L 29/66825* (2013.01); *H01L 29/7881* (2013.01)

(58) Field of Classification Search
CPC .............. H10B 41/30; H01L 29/40114; H01L 29/42328

See application file for complete search history.

(56) References Cited

U.S. PATENT DOCUMENTS

| | | |
|---|---|---|
| 6,069,040 A | 5/2000 | Miles |
| 6,090,668 A | 7/2000 | Lin |
| 6,114,723 A | 9/2000 | Leu |
| 6,117,733 A | 9/2000 | Sung |
| 6,172,394 B1 | 1/2001 | Nakagawa |
| 6,194,300 B1 | 2/2001 | Hung |
| 6,297,099 B1 | 10/2001 | Hsieh |

(Continued)

*Primary Examiner* — Errol V Fernandes
(74) *Attorney, Agent, or Firm* — Winston Hsu

(57) ABSTRACT

A method of forming a flash memory cell includes the following steps. A first dielectric layer and a floating gate layer are deposited on a substrate sequentially. Three blocking structures having oblique sidewalls broaden from bottom to top penetrating through the first dielectric layer and the floating gate layer are formed. A first part and a second part of the floating gate layer between two adjacent blocking structures are etched respectively, so that a first floating gate having two sharp top corners and oblique sidewalls, and a second floating gate having two sharp top corners and oblique sidewalls, are formed. The three blocking structures are removed. A first isolating layer and a first selective gate covering the first floating gate are formed and a second isolating layer and a second selective gate covering the second floating gate are formed. A flash memory cell formed by said method is also provided.

10 Claims, 4 Drawing Sheets

(56) References Cited

U.S. PATENT DOCUMENTS

| | | |
|---|---|---|
| 6,331,464 B1 | 12/2001 | Liou |
| 6,355,527 B1 | 3/2002 | Lin |
| 6,563,168 B2 | 5/2003 | Lee |
| 6,586,302 B1 * | 7/2003 | Hopper ............. H01L 29/40114 |
| | | 438/257 |
| 6,656,796 B2 | 12/2003 | Chan |
| 6,921,694 B2 | 7/2005 | Chuang |
| 7,253,470 B1 | 8/2007 | Liu |
| 7,297,598 B2 | 11/2007 | Liu |
| 7,785,966 B2 * | 8/2010 | Liu .................... H01L 29/40114 |
| | | 438/981 |
| 10,515,971 B2 | 12/2019 | Kumar |
| 2001/0016385 A1 | 8/2001 | Chiang |
| 2004/0058494 A1 | 3/2004 | Choi |

\* cited by examiner

FLASH MEMORY CELL

CROSS REFERENCE TO RELATED APPLICATIONS

This application is a continuation application of U.S. application Ser. No. 17/198,268, filed on Mar. 11, 2021. The content of the application is incorporated herein by reference.

BACKGROUND OF THE INVENTION

1. Field of the Invention

The present invention relates generally to a memory cell and forming method thereof, and more specifically to a flash memory cell and forming method thereof.

2. Description of the Prior Art

Memory is divided into two categories: volatile memory and non-volatile memory. In nowadays, the two important types of volatile memory are static random access memory (SRAM) and dynamic random access memory (DRAM). There are many types of non-volatile memory. Flash memory is the most popular type, and other types may include silicon-oxide-nitride-oxide-silicon (SONOS), ferroelectric random access memory (FRAM), phase-change random access memory (PRAM), magnetoresistive access memory (MRAM) and resistive random access memory (RRAM).

SUMMARY OF THE INVENTION

The present invention provides a flash memory cell, which includes a floating gate having two sharp top corners and oblique sidewalls, so that the erasing ability of the memory cell can be improved and the erasing speed can be controlled by adjusting the sharp top corners and the oblique sidewalls of the floating gate.

The present invention provides a flash memory cell including a first floating gate, a first dielectric layer, a first isolating layer and a first selective gate. The first floating gate having two sharp top corners and oblique sidewalls is disposed on a substrate. The two sharp top corners protrude upwardly from a top surface of the first floating gate. The oblique sidewalls of the first floating gate are inclined inwardly from bottom to top, and each of the oblique sidewalls of the first floating gate has a constant slope. The first dielectric layer is sandwiched by the first floating gate and the substrate. The first isolating layer and the first selective gate cover the first floating gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
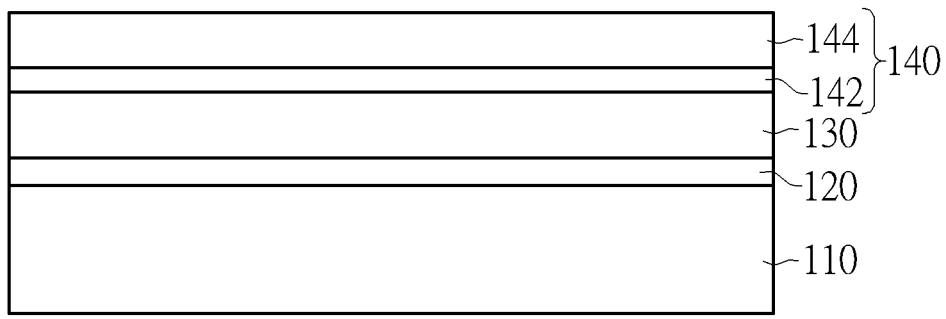
FIG. 1 schematically depicts a cross-sectional view of a method of forming a flash memory cell according to an embodiment of the present invention.

FIGS. 1-8 schematically depict cross-sectional views of a method of forming a flash memory cell according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Only a memory cell area of the substrate 110 is depicted in these figures.

A first dielectric layer 120 and a floating gate layer 130 are sequentially deposited on the substrate 110. In this embodiment, the first dielectric layer 120 includes an oxide layer, and the floating gate layer 130 includes a polysilicon layer, but it is not restricted thereto. A second dielectric layer 140 is then deposited on the floating gate layer 130 after the floating gate layer 130 is deposited for patterning the floating gate layer 130 and the first dielectric layer 120. In a preferred embodiment, the second dielectric layer 140 includes an oxide layer 142 and a nitride layer 144 stacked from bottom to top, but it is not limited thereto.

Figure 2:
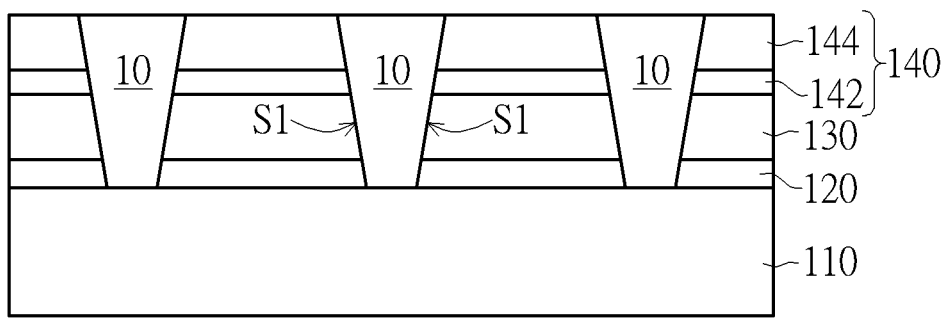
FIG. 2 schematically depicts a cross-sectional view of a method of forming a flash memory cell according to an embodiment of the present invention.

As shown in FIG. 2, three blocking structures 10 penetrate through the second dielectric layer 140, the floating gate layer 130 and the first dielectric layer 120. In the present invention, the three blocking structures 10 have oblique sidewalls broaden from bottom to top, for forming floating gates in later processes. Preferably, the blocking structures 10 include isolation structures. Still preferably, the blocking structures 10 include shallow trench isolation structures (STI), which is formed by a shallow trench isolation (STI) process.

Figure 3:
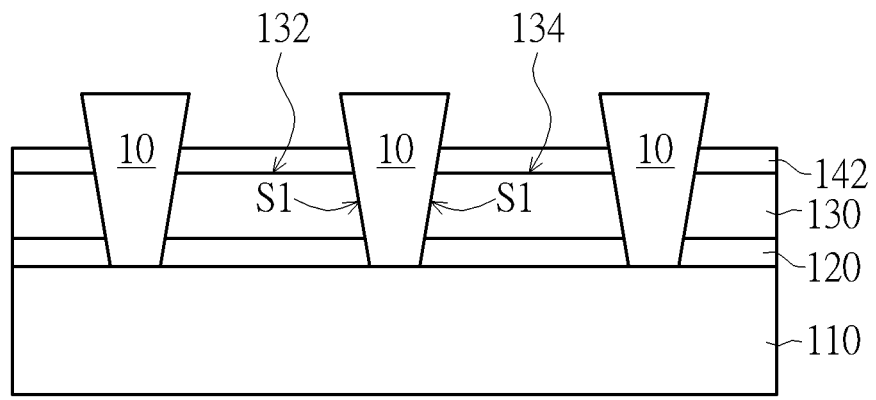
FIG. 3 schematically depicts a cross-sectional view of a method of forming a flash memory cell according to an embodiment of the present invention.

The nitride layer 144 is removed first, as shown in FIG. 3. Please refer to FIGS. 3-4, a first part 132 and a second part 134 of the floating gate layer 130 are etched between two adjacent blocking structures 10, so that a first floating gate 130a having oblique sidewalls S2 and two sharp top corners C1 shadowed by the blocking structures 10, and a second floating gate 130b having oblique sidewalls S3 and two sharp top corners C2 shadowed by the blocking structures being formed, and a floating gate layer 130c is left. Due to the first floating gate 130a having two sharp top corners C1 and oblique sidewalls S2, and the second floating gate 130b having two sharp top corners C2 and oblique sidewalls S3, the erasing ability of the formed memory cell can be improved and the erasing speed can be controlled. By applying this self-aligning method of forming the first floating gate 130a and the second floating gate 130b, shapes of the first floating gate 130a and the second floating gate 130b can be flexible, and sizes of the first floating gate 130a and the second floating gate 130b can be shrunk to increase cell pattern density.

In this embodiment, the oxide layer 142 is removed while the first part 132 and the second part 134 of the floating gate layer 130 are etched for adjusting the etching easily. The etching depths d of the first part 132 and the second part 134 of the floating gate layer 130 or/and the oblique sidewalls S1 of the blocking structures 10 can be adjusted to improve the erasing performance. In this case, the first part 132 and the second part 134 of the floating gate layer 130 are etched at a same time. In another case, the first part 132 and the second part 134 of the floating gate layer 130 may be etched by different processing steps.

Figure 4:
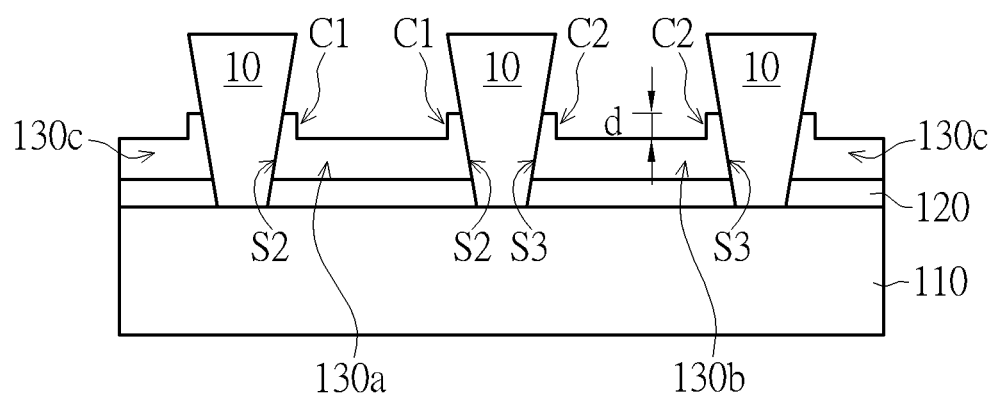
FIG. 4 schematically depicts a cross-sectional view of a method of forming a flash memory cell according to an embodiment of the present invention.
Figure 5:
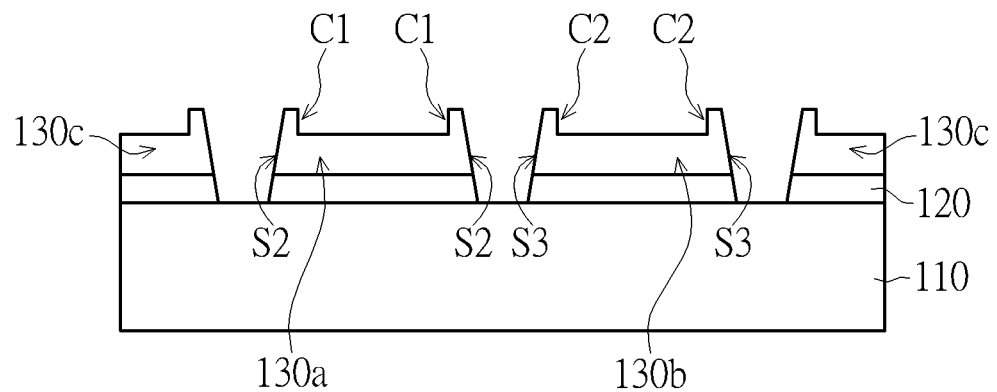
FIG. 5 schematically depicts a cross-sectional view of a method of forming a flash memory cell according to an embodiment of the present invention.
Figure 6:
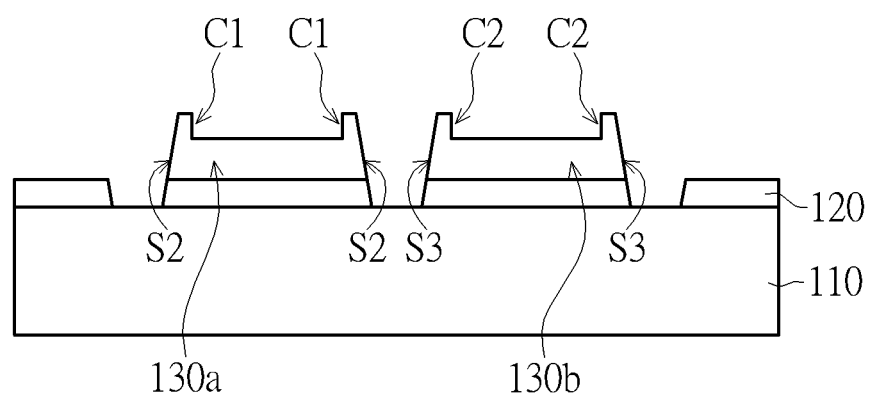
FIG. 6 schematically depicts a cross-sectional view of a method of forming a flash memory cell according to an embodiment of the present invention.

Thereafter, the three blocking structures 10 are removed, as shown in FIGS. 4-5, and the first floating gate 130a is apart from the second floating gate 130b. The floating gate layer 130c is removed and a part of the first dielectric layer 120 is thus exposed, as shown in FIGS. 5-6.

Figure 7:
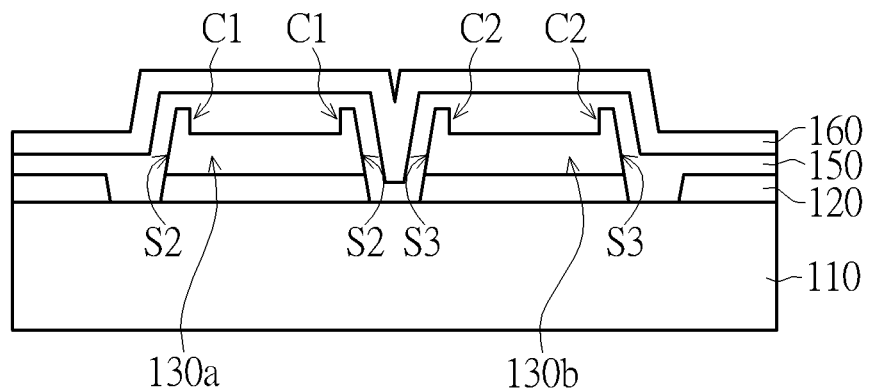
FIG. 7 schematically depicts a cross-sectional view of a method of forming a flash memory cell according to an embodiment of the present invention.
Figure 8:
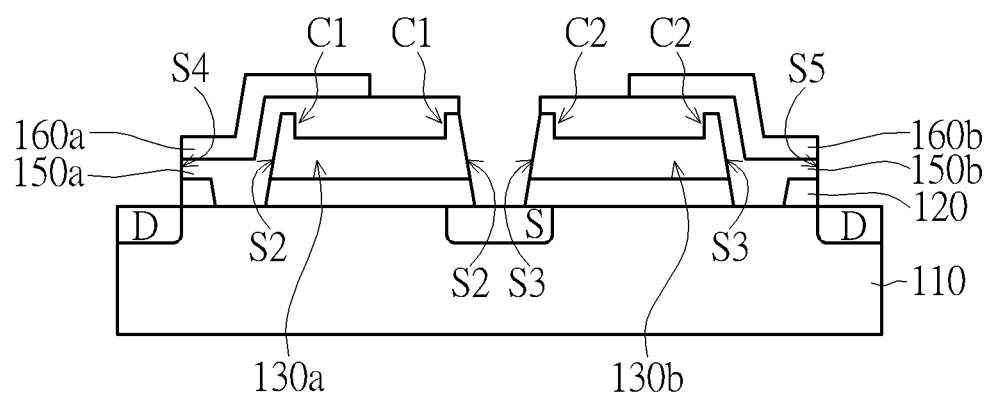
FIG. 8 schematically depicts a cross-sectional view of a method of forming a flash memory cell according to an embodiment of the present invention.

Please refer to FIGS. 7-8, a first isolating layer 150a and a first selective gate 160a cover the first floating gate 130a, and a second isolating layer 150b and a second selective gate 160b cover the second floating gate 130b. More precisely, steps of forming the first isolating layer 150a, the first selective gate 160a, the second isolating layer 150b and the second selective gate 160b may include the following. As shown in FIG. 7, an isolating layer 150 and a selective gate layer 160 sequentially deposited to conformally cover the first floating gate 130a, the second floating gate 130b and the substrate 110. Then, the selective gate layer 160 and the isolating layer 150 are patterned respectively or/and several times, thereby the first isolating layer 150a, the first selective gate 160a, the second isolating layer 150b and the second selective gate 160b are formed, as shown in FIG. 8. In another embodiment, the isolating layer 150 is deposited and patterned to form the first isolating layer 150a and the second isolating layer 150b, and then the selective gate layer 160 is deposited and patterned to form the first selective gate 160a and the second selective gate 160b. Exposed parts 122 of the first dielectric layer 120 are removed while the patterning or after the patterning.

A source region S is formed between the first floating gate 130a and the second floating gate 130b, drain regions D are formed at a side S4 of the first floating gate 130a opposite to the source region S and at a side S5 of the second floating gate 130b opposite to the source region S.

The first isolating layer 150a and the first selective gate 160a at least cover the sharp top corner C1 of the first floating gate 130a near the corresponding drain region D, and the second isolating layer 150b and the second selective gate 160b at least cover the sharp top corner C2 of the second floating gate 130b near the corresponding drain region D. In this embodiment, the first isolating layer 150a covers the whole first floating gate 130a while the first selective gate 160a only overlaps the sharp top corner C1 of the first floating gate 130a near the corresponding drain region D, and the second isolating layer 150b covers the whole second floating gate 130b while the second selective gate 160b only overlaps the sharp top corner C2 of the second floating gate 130b near the corresponding drain region D, but it is not limited thereto. In other words, the first selective gate 160a exposes a part of the first isolating layer 150a and the second selective gate 160b exposes a part of the second isolating layer 150b.

To summarize, the present invention provides a flash memory cell and forming method thereof, which includes a floating gate having two sharp top corners and oblique sidewalls, so that the erasing ability of the memory cell can be improved and the erasing speed can be controlled by adjusting the sharp top corners and the oblique sidewalls of the floating gate.

Furthermore, blocking structures having oblique sidewalls broaden from bottom to top are utilized for self-aligning the floating gate. Hence, the shape of the floating gate can be flexible, and the size of the floating gate can be shrunk to increase cell pattern density.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory cell, comprising:
   a first floating gate having two sharp top corners and oblique sidewalls disposed on a substrate, wherein the two sharp top corners protrude upwardly from a top surface of the first floating gate, each of the two sharp top corners has a flat top surface, the oblique sidewalls of the first floating gate are inclined inwardly from bottom to top, and each of the oblique sidewalls of the first floating gate has a constant slope;
   a first dielectric layer sandwiched by the first floating gate and the substrate; and
   a first isolating layer and a first selective gate covering the first floating gate.

2. The flash memory cell according to claim 1, further comprising:
   a second floating gate having two sharp top corners and oblique sidewalls disposed beside the first floating gate; and
   a second isolating layer and a second selective gate covering the second floating gate.

3. The flash memory cell according to claim 2, wherein the first selective gate overlaps one of the two sharp top corners of the first floating gate, and the second selective gate overlaps one of the two sharp top corners of the second floating gate.

4. The flash memory cell according to claim 2, further comprising:
   a source region located between the first floating gate and the second floating gate; and
   drain regions located at a side of the first floating gate opposite to the source region and at a side of the second floating gate opposite to the source region.

5. The flash memory cell according to claim 1, wherein the first floating gate has a width decreasing from bottom to top.

6. The flash memory cell according to claim 1, wherein the first dielectric layer has two oblique sidewalls, the oblique sidewalls of the first dielectric layer are inclined inwardly from bottom to top, and each of the oblique sidewalls of the first dielectric layer has a constant slope.

7. The flash memory cell according to claim 1, wherein the first dielectric layer has a width decreasing from bottom to top.

8. The flash memory cell according to claim 1, wherein the first isolating layer directly contacts one of the oblique sidewalls of the first floating gate and an oblique sidewall of the first dielectric layer.

9. The flash memory cell according to claim 1, wherein the first isolating layer covers the top surface of the first floating gate and integrally extends from the top surface of the first floating gate to cover one of the oblique sidewalls of the first floating gate, and the first isolating layer does not cover the other one of the oblique sidewalls of the first floating gate.

10. The flash memory cell according to claim 1, wherein the two sharp top corners integrally protrude from the top surface of the first floating gate, and the first floating gate is a single-piece structure.

* * * * *